United States Patent
Jow

(10) Patent No.: US 7,670,146 B2
(45) Date of Patent: Mar. 2, 2010

(54) STACK STRUCTURE OF SEMICONDUCTOR PACKAGES AND MANUFACTURING METHOD THEREOF

(76) Inventor: En-Min Jow, 11F., No. 38-15, Lane 72, Kwang Hwa $2^{nd}$ St., Hsinchu (TW)

( * ) Notice: Subject to any disclaimer, the term of this patent is extended or adjusted under 35 U.S.C. 154(b) by 337 days.

(21) Appl. No.: 11/790,319

(22) Filed: Apr. 25, 2007

(65) Prior Publication Data

US 2007/0199853 A1  Aug. 30, 2007

(30) Foreign Application Priority Data

Feb. 16, 2007  (TW) .............................. 96106150 A

(51) Int. Cl.
  *H01R 12/00*  (2006.01)
  *H05K 1/00*  (2006.01)
(52) U.S. Cl. ...................................................... 439/65
(58) Field of Classification Search ............. 439/65–67, 439/69, 74, 77
  See application file for complete search history.

(56) References Cited

U.S. PATENT DOCUMENTS

| 5,002,493 | A | * | 3/1991 | Brown et al. ................... | 439/65 |
| 5,026,290 | A | * | 6/1991 | Dery ............................ | 439/65 |
| 6,712,622 | B1 | * | 3/2004 | Self et al. ..................... | 439/65 |
| 6,932,617 | B2 | * | 8/2005 | Debord et al. ................ | 439/65 |

* cited by examiner

*Primary Examiner*—Javaid Nasri
(74) *Attorney, Agent, or Firm*—Muncy, Geissler, Olds & Lowe, PLLC

(57) ABSTRACT

A stack structure of the semiconductor packages and the manufacturing method thereof are disclosed herein. The packages of the present invention utilize plural stackable plug-receivers, which are similar to connectors, to stack and electrically connect with each other. The stack height of the stacked packages can be effectively reduced by utilizing the protrusion of a plug-receiver of one package to match with the concavity of a plug-receiver of another package at the corresponding position. Meanwhile, utilizing the stackable plug-receiver to replace the conventional soldering method can improve the warpage problem, and so as to promote the product reliability.

19 Claims, 6 Drawing Sheets

STACK STRUCTURE OF SEMICONDUCTOR PACKAGES AND MANUFACTURING METHOD THEREOF

BACKGROUND OF THE INVENTION

1. Field of the Invention

The present invention relates to a stack structure of semiconductor packages and the manufacturing method thereof, and more particularly, to a stack structure of semiconductor packages and the manufacturing method thereof which utilize connectors as the electrical connection structure.

2. Description of the Prior Art

Along with the rapid progress of the computer and internet communication, the semiconductor products need to be multi-functional, portable, light, thin, and small-sized to satisfy the customers' demand. Therefore, the industry of chip package has to develop towards the high accurate processes to comply with the requirements of high-power, high-density, lightness, thinness, compactness and mini-size. In addition, the electronics packaging also needs to have the features including high reliability and good thermal dissipation to transmit signals and provide electrical power, and provide effective routes for thermal dissipation, structural protection and support.

Presently, the three-dimensional (3-D) package may be classified into two categories, the Package on Package (PoP) and the Package in Package (PiP). The PoP is a typical 3-D package, which utilizes the process technology to stack two independent completed packages. In the other way, PiP utilizes a spacer to stack a single package without mounting solder balls onto a chip and then package them together using the Epoxy Molding Compound (EMC). Because the PoP utilizes the method of the Surface Mount Technology (SMT) to stack two independent packages which have been packaged and tested, it may reduce the process risk and so as to promote the product yield.

Please refer to FIG. 1A and FIG. 1B, FIG. 1A and FIG. 1B are a solid schematic diagram and a cross-sectional schematic diagram for the manufacturing process of a conventional PoP package. A Printed Circuit Board (PCB) spacer 30 is set between the electrical connections of the carrier plates for two packages 10, 20, and the SMT method is utilized to fuse the two packages 10, 20. Because the conductive terminals 32 on the PCB spacer 30 have to be set one on one corresponding to the terminals 12, 22 on the carrier plate of the packages 10, 20, the inaccurate alignment and the bad connection between the materials are two possible problems. Additionally, a warpage phenomenon may be induced by the different Thermal Expansion Coefficients (TECs) of the different materials, and the bad connection may further lead to a popcorn phenomenon.

SUMMARY OF THE INVENTION

In order to solve the aforementioned problems, one object of the present invention is to provide a stack structure of semiconductor packages and the manufacturing method thereof, utilizing the stackable plug-receivers to replace the conventional soldering way to resolve the alignment problem of the surface mount technology.

One object of the present invention is to provide a stack structure of semiconductor packages and the manufacturing method thereof, utilizing a protrusion of one plug-receiver to match with a concavity of another plug-receiver at the corresponding position to stack the packages can effectively reduce the stack height of the stacked packages.

One object of the present invention is to provide a stack structure of semiconductor packages and the manufacturing method thereof, utilizing the connectors to serve as the electrical connection structure can effectively resolve the reliability problem of the surface mount technology.

One object of the present invention is to provide a stack structure of semiconductor packages and the manufacturing method thereof, utilizing the stackable plug-receivers to replace the conventional soldering way can not only facilitate the package being easy to plug in or out, but also improve the warpage problem of the packages to promote the product reliability.

One object of the present invention is to provide a stack structure of semiconductor packages and the manufacturing method thereof, the production cost can be lowered down because of the simple manufacturing process.

To achieve the above-mentioned objects, one embodiment of the present invention is to provide a stack structure of semiconductor packages, including: a first package having a first carrier plate, wherein a plurality of first conductive terminals are arranged on an upper surface and a lower surface of the first carrier plate; at least one first plug-receiver clamped on the first carrier plate and electrically connected with the first conductive terminals, wherein the first plug-receiver has a first concavity; a second package having a second carrier plate, wherein a plurality of second conductive terminals are arranged on an upper surface and a lower surface of the second carrier plate; and at least one second plug-receiver clamped on the second carrier plate and electrically connected with the second conductive terminals, wherein the second plug-receiver has a first protrusion inserting into the first concavity of the first plug-receiver to electrically connect the first package and the second package.

To achieve the above-mentioned objects, another embodiment of the present invention is to provide a manufacturing method of a stack structure of semiconductor packages, including: providing a first package having a first carrier plate, wherein a plurality of first conductive terminals are arranged on an upper surface and a lower surface of the first carrier plate; providing at least one first plug-receiver to clamp on the first carrier plate and electrically connect with the first conductive terminals, wherein the first plug-receiver has a first concavity; providing a second package having a second carrier plate, wherein a plurality of second conductive terminals are arranged on an upper surface and a lower surface of the second carrier plate; and providing at least one second plug-receiver to clamp on the second carrier plate and electrically connect with the second conductive terminals, wherein the second plug-receiver has a first protrusion inserting into the first concavity of the first plug-receiver to electrically connect the first package and the second package.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

Figure 1A:
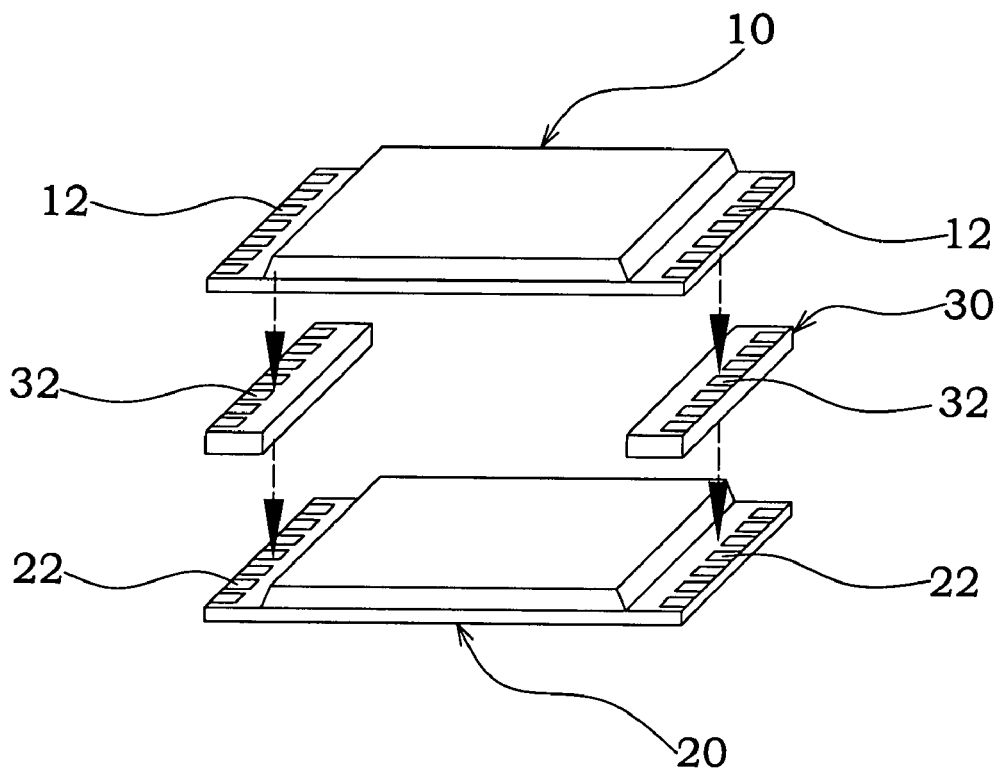
FIG. 1A and FIG. 1B are a solid schematic diagram and a cross-sectional schematic diagram for the manufacturing process of a conventional PoP package.
Figure 1B:
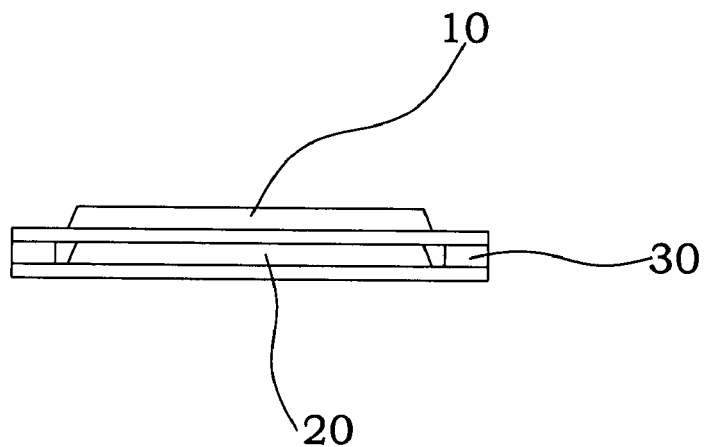
Figure 2A:
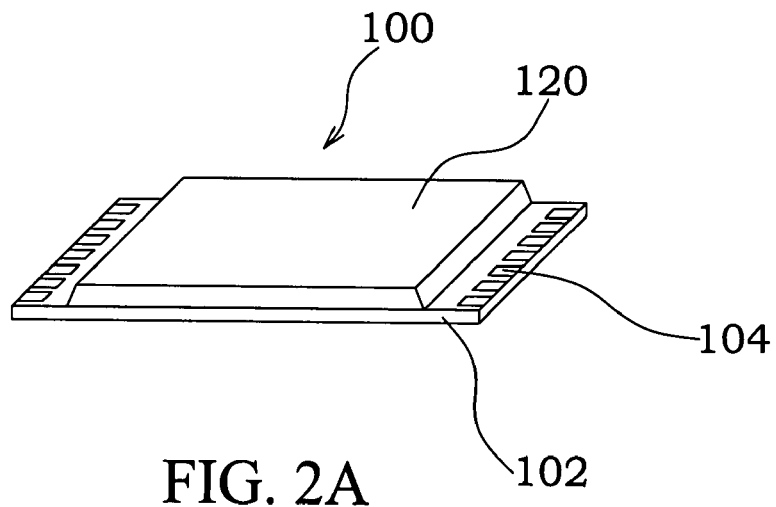
FIG. 2A, FIG. 2B and FIG. 2C are the cross-sectional schematic diagrams for the manufacturing method of a stack structure of semiconductor packages according to one embodiment of the present invention.
Figure 2B:
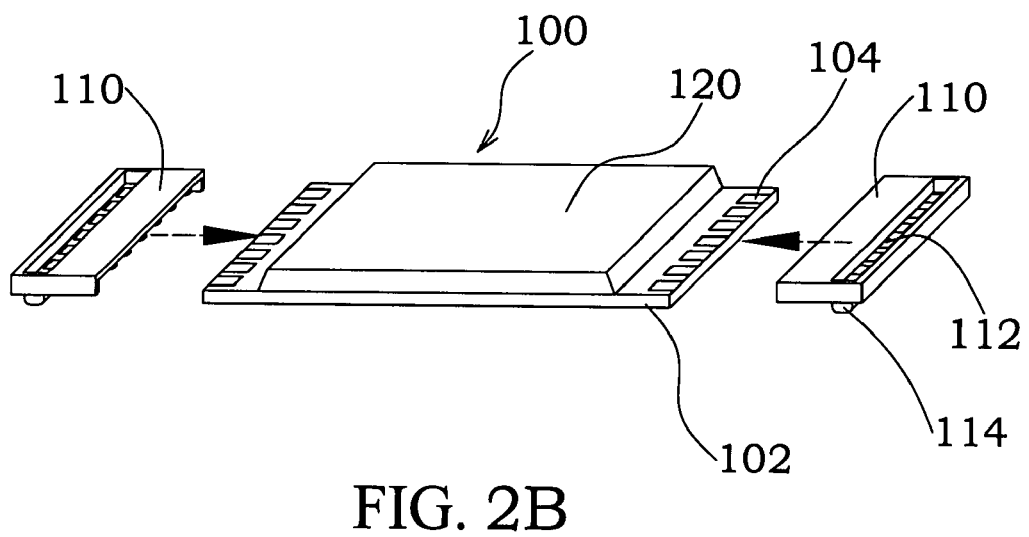
Figure 2C:
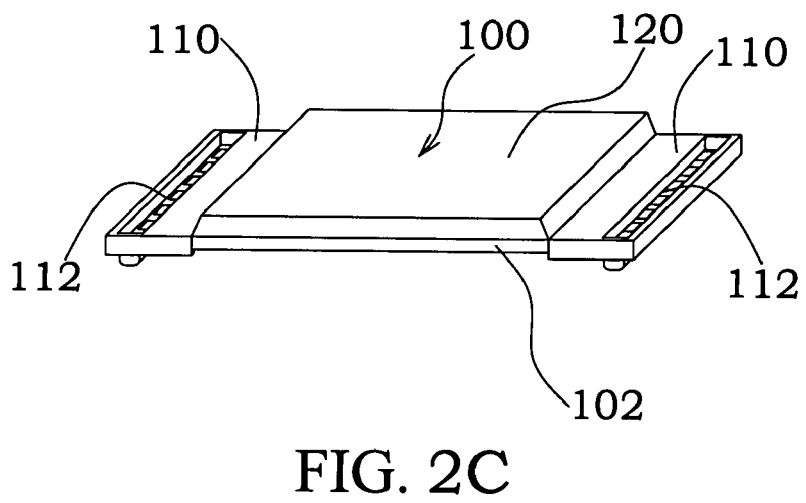

Firstly, please refer to FIG. 2A, FIG. 2B and FIG. 2C, FIG. 2A, FIG. 2B and FIG. 2C are the cross-sectional schematic diagrams for the manufacturing method of a stack structure of semiconductor packages according to one embodiment of the present invention. Please refer to FIG. 2A, a package 100 having a carrier plate 102 is provided, wherein a plurality of conductive terminals 104 are arranged on an upper surface and a lower surface of the carrier plate 102. In this embodiment, the conductive terminals 104 are distributed on two opposite sides of the carrier plate 102. It can be appreciated that the distribution of the conductive terminals 104 is dependent on the design of the carrier plate 102, it is not limited by which depicted in FIG. 2A. In one embodiment, the package 100 further includes: a chip (not shown in the figure) arranged on the carrier plate 102; a plurality of conductive connection parts (not shown in the figure) to electrically connect the carrier plate 102 and the chip; and a molding compound 120 to cover the chip, the conductive connection parts and a portion of the carrier plate 102 and expose the conductive terminals 104. Next, as shown in FIG. 2B and FIG. 2C, at least one plug-receiver 110 is provided. The plug-receiver 110 are respectively clamped according to the arrow directions in FIG. 2B on the carrier plate 102 and electrically connected with the conductive terminals 104, wherein each plug-receiver 110 has a concavity 112. In one embodiment, the plug-receiver 110 further includes a protrusion 114 arranged oppositely to the concavity 112. Meanwhile, the stack structure of packages can be achieved by utilizing the protrusion 114 and the concavity 112 of one package to proceed the engagement action with another package which has the same or similar matching structure. The details are described in the following embodiments.

Figure 3A:
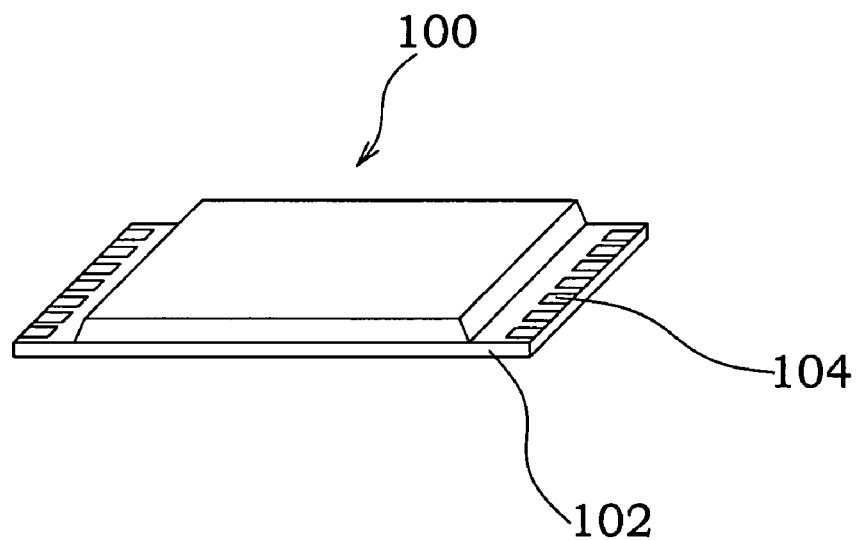
FIG. 3A, FIG. 3B, FIG. 3C, FIG. 3D, FIG. 3E-1, FIG. 3E-2, FIG. 3F and FIG. 3G are the cross-sectional schematic diagrams for the manufacturing method of a stack structure of semiconductor packages according to one embodiment of the present invention.
Figure 3B:
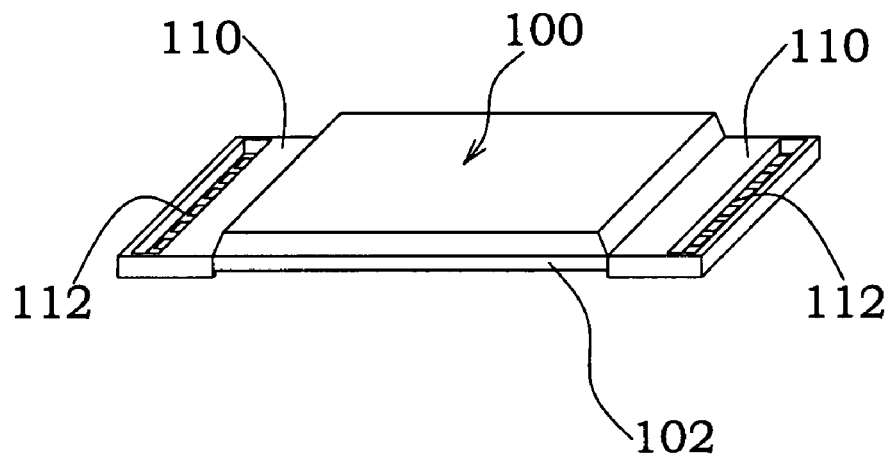
Figure 3C:
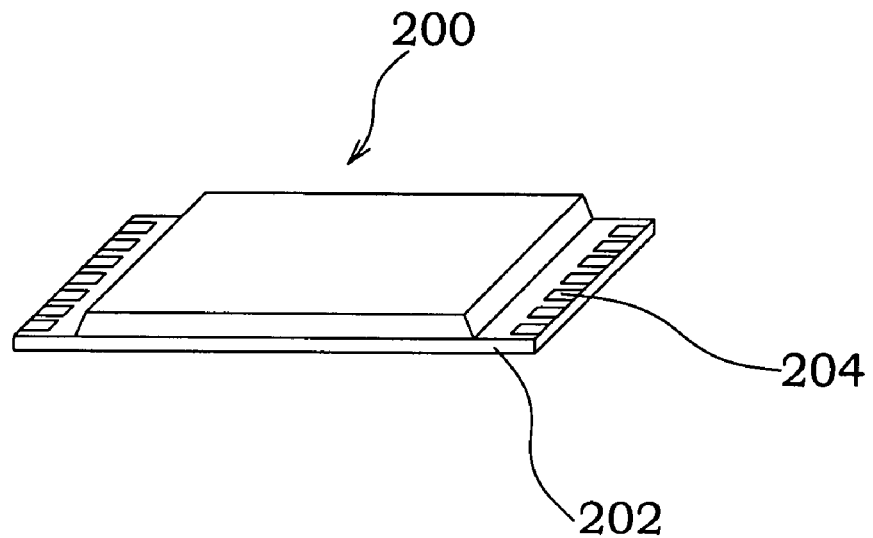
Figure 3D:
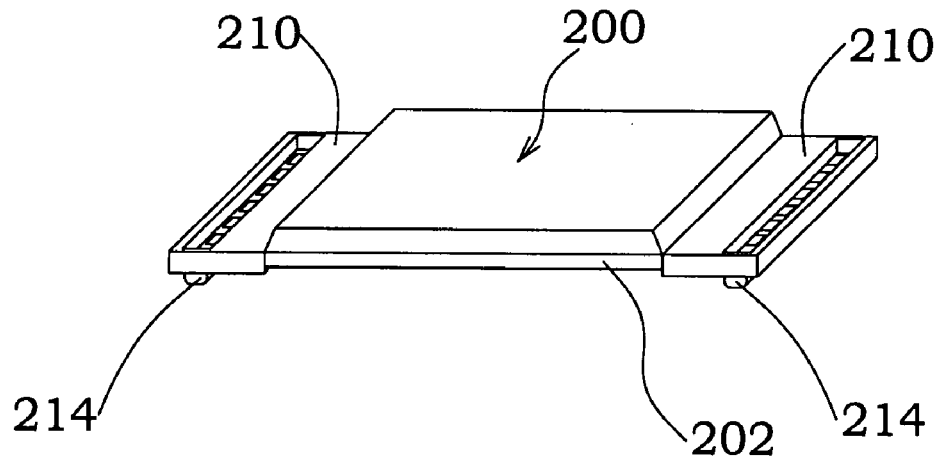
Figures 1, 3E:
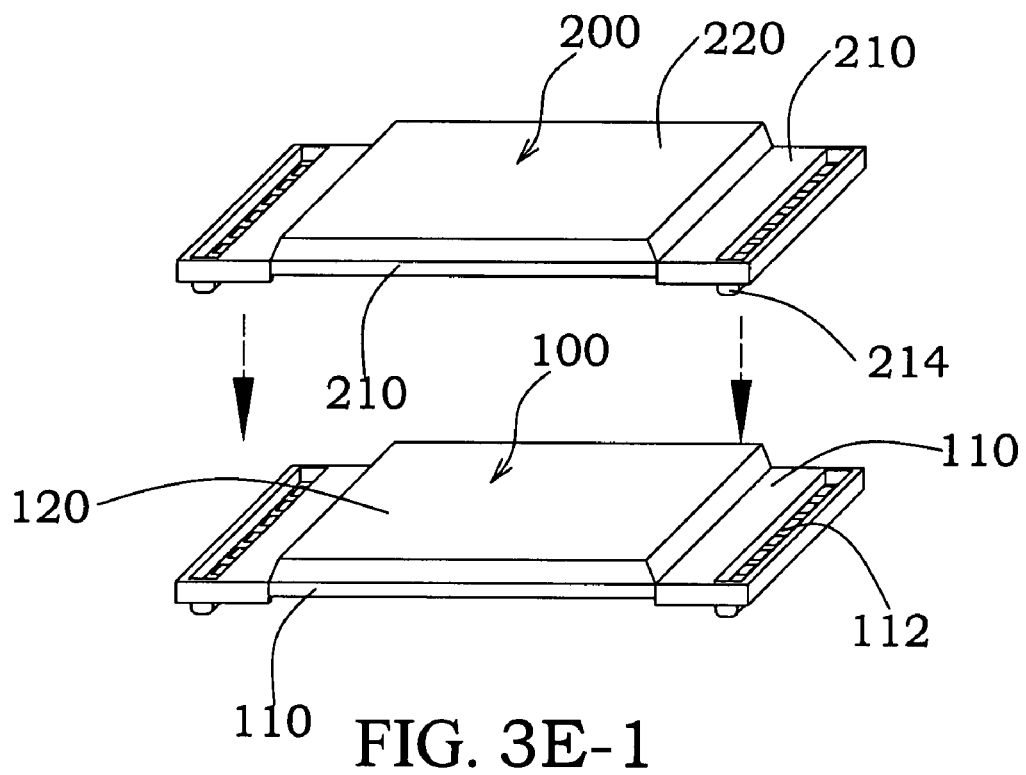
Figures 2, 3E:
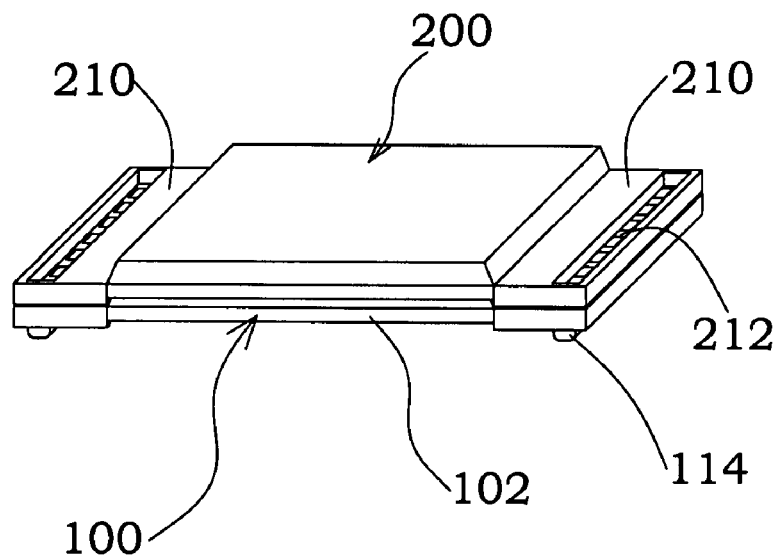
Figure 3F:
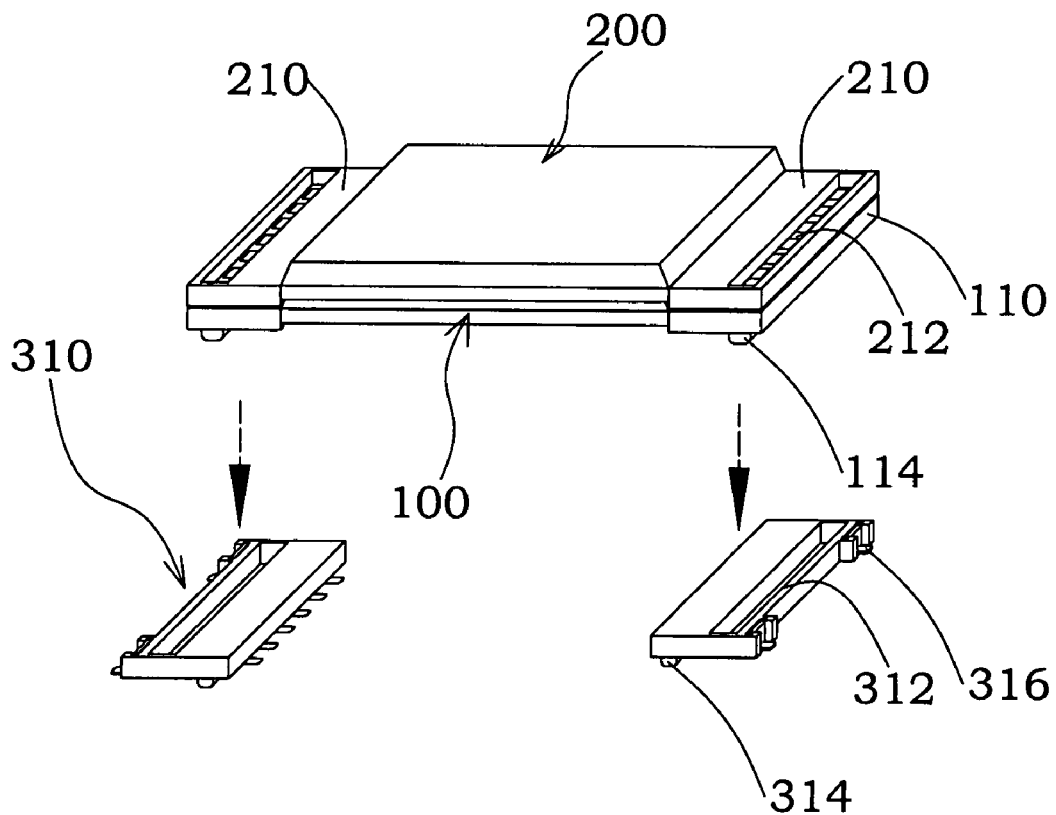
Figure 3G:
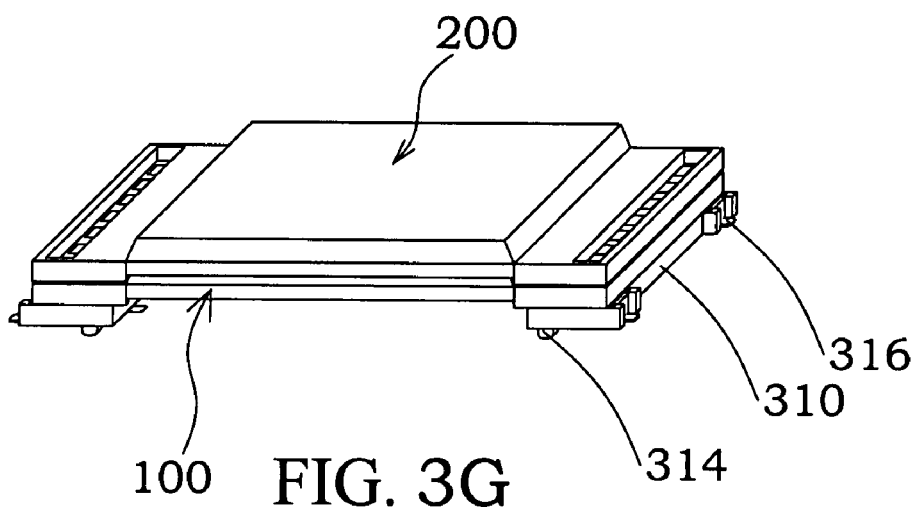

Secondly, please refer to FIG. 3A, FIG. 3B, FIG. 3C, FIG. 3D, FIG. 3E-1, FIG. 3E-2, FIG. 3F and FIG. 3G, FIG. 3A, FIG. 3B, FIG. 3C, FIG. 3D, FIG. 3E-1, FIG. 3E-2, FIG. 3.F and FIG. 3G are the cross-sectional schematic diagrams for the manufacturing method of a stack structure of semiconductor packages according to one embodiment of the present invention. Please refer to FIG. 3A and FIG. 3B, a first package 100 having a first carrier plate 102 is provided, wherein a plurality of first conductive terminals 104 are arranged on an upper surface and a lower surface of the first carrier plate 102. In this embodiment, the first conductive terminals 104 are distributed on two opposite sides of the first carrier plate 102. It can be appreciated that the distribution of the first conductive terminals 104 is dependent on the design of the first carrier plate 102, it is not limited by which depicted in the figures. Next, at least one first plug-receiver 110 is provided. The first plug-receiver 110 is clamped on the first carrier plate 102 and electrically connected with the first conductive terminals 104, wherein the first plug-receiver 110 has a concavity 112. Then, please refer to FIG. 3C, a second package 200 having a second carrier plate 202 is provided, wherein a plurality of second conductive terminals 204 are arranged on an upper surface and a lower surface of the second carrier plate 202. In this embodiment, the second conductive terminals 204 are distributed on two opposite sides of the second carrier plate 202. Afterward, as shown in FIG. 3D, at least one second plug-receiver 210 is provided. The second plug-receiver 210 is clamped on the second carrier plate 202 and electrically connected with the second conductive terminals 204, wherein the second plug-receiver 210 has a protrusion 214 inserting into the concavity 112 of the first plug-receiver 110 to electrically connect the first package 100 and the second package 200, as shown in FIG. 3E-1 and FIG. 3E-2.

Continuing the above description, in one embodiment, as shown in FIG. 3F, the stack structure further includes at least one base 310, such as a connector, arranged below the first plug-receiver 110, wherein the base 310 has an accommodation trench 312 to engage with the protrusion 114 of the first plug-receiver 110 and so as to form the stack structure shown in FIG. 3G. In this embodiment, the stack structure further includes a fixing bump 314 arranged on the base 310 to fix the base 310 onto a mother board (not shown in the figure). Additionally, the stack structure further includes at least one solder plate 316 arranged on the base 310 to enhance the stability of the stack structure after it is set on the mother board.

FIG. 3E-1 is a cross-sectional schematic diagram for a stack structure of semiconductor packages according to one embodiment of the present invention. The stack structure of semiconductor packages includes: a first package 100 having a first carrier plate 102, wherein a plurality of first conductive terminals 104, as shown in FIG. 3A, are arranged on an upper surface and a lower surface of the first carrier plate 102; at least one first plug-receiver 110, such as a connector, clamped on the first carrier plate 102 and electrically connected with the first conductive terminals 104, wherein the first plug-receiver 110 has a concavity 112; a second package 200 having a second carrier plate 202, wherein a plurality of second conductive terminals 204, as shown in FIG. 3C, are arranged on an upper surface and a lower surface of the second carrier plate 202; and at least one second plug-receiver 210, such as a connector, clamped on the second carrier plate 202 and electrically connected with the second conductive terminals 204, wherein the second plug-receivers 210 has a protrusion 214 inserting into the concavity 112 of the first plug-receiver 110 to electrically connect the first package 100 and the second package 200. In one embodiment, the packages 100 and 200 respectively include: two chips (not shown in the figure) respectively arranged on the carrier plate 102 and 202; a plurality of conductive connection parts (not shown in the figure) to electrically connect the carrier plates 102, 202 and the chips; and a molding compound 120, 220 to cover the chips, the conductive connection parts and a portion of the carrier plates 102, 202 and expose the conductive terminals 104, 204, as shown in FIG. 3A and FIG. 3B.

Continuing the above description, in the present embodiment, as shown in FIG. 3E-1, the first plug-receiver 110 further includes a protrusion 114 arranged oppositely to the concavity 112 to stack another package. By the similar reason, the second plug-receiver 210 also further includes a concavity 212 arranged oppositely to the protrusion 214 to stack another package, and so the stack structure of packages can be achieved by utilizing a concavity of one plug-receiver to match with a protrusion of another plug-receiver or utilizing a protrusion of one plug-receiver to match with a concavity of another plug-receiver to upwardly or downwardly stack multiple packages. Wherein the packages, such as the package 100, 200, may have the same structure; and the plug-receivers, such as the plug-receivers 110, 210, may also have the same structure. It can be appreciated that they are not limited by which depicted in the figures. Only if have the plug-receivers concavities and protrusions which can match other, the stack structure of packages can be achieved even the plug-receivers have different structures.

Next, in another embodiment, please refer to FIG. 3F and FIG. 3G, the stack structure may further include a base 310, such as a connector, arranged below the first plug-receiver 110 to fix the stacked packages 100, 200 onto a mother board (not shown in the figure) and electrically connect with each other; wherein the description for the related structure, such as the fixing bump 314 and the solder plate 316, has explained in the previous embodiment, it is not to further describe herein. It needs to explain that the stacked packages 100, 200 may be electrically conducted respectively via the plug-receivers 110, 210 and then via the electrical contact of the plug-receiver 110 and the base 310, and finally be able to transmit signals via the electrical connection of the base 310 and the mother board. In addition, the solder plate 316 may be symmetrically arranged on the base 310, as shown in the figures, to stably fix the stack packages on the mother board, and so as to provide better stability.

According to the above description, one feature of the present invention is utilizing the stackable plug-receivers, which are similar to connectors, to replace the conventional conduction structure. It is not only convenient to stack, but also is convenient to plug in or out, and be convenient to be replaced if damaged. Meanwhile, utilizing the engagement way of the plug-receivers to repeatedly stack the packages may cooperatively adopt a special design for the plug-receiver to improve the warpage problem induced by heat or external force. Furthermore, the plugging way, which has no problem of accurate alignment, is simpler than the soldering way.

To summarize, the present invention provides a stack structure of the semiconductor packages and the manufacturing method thereof, utilizing the stackable plug-receivers to replace the conventional soldering way to resolve the problem of accurate alignment of the surface mount technology. Meanwhile, utilizing a protrusion of one plug-receiver to match with a concavity of another plug-receiver at the corresponding position to stack the packages can effectively reduce the stack height of the stacked packages. Additionally, utilizing the connectors to serve as the electrical connection structure can effectively resolve the reliability problem of the surface mount technology. Further, utilizing the stackable plug-receivers to replace the conventional soldering way can not only facilitate the package being easy to plug in or out, but also improve the warpage problem of the packages to promote the product reliability. Furthermore, the production cost can be lowered down because of the simple manufacturing process.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A stack structure of semiconductor packages, comprising:
    a first package having a first carrier plate, wherein a plurality of first conductive terminals are arranged on an upper surface and a lower surface of the first carrier plate;
    at least one first plug-receiver clamped on the first carrier plate and electrically connected with the first conductive terminals, wherein the first plug-receiver has a first concavity;
    a second package having a second carrier plate, wherein a plurality of second conductive terminals are arranged on an upper surface and a lower surface of the second carrier plate; and
    at least one second plug-receiver clamped on the second carrier plate and electrically connected with the second conductive terminals, wherein the second plug-receiver has a first protrusion inserting into the first concavity of the first plug-receiver to electrically connect the first package and the second package.

2. The stack structure of semiconductor packages according to claim 1, wherein the first plug-receiver further comprises a second protrusion arranged oppositely to the first concavity.

3. The stack structure of semiconductor packages according to claim 2 further comprising at least one base arranged below the first plug-receiver, wherein the base has an accommodation trench to engage with the second protrusion of the first plug-receiver.

4. The stack structure of semiconductor packages according to claim 3, wherein the base is electrically connected with the first plug-receiver.

5. The stack structure of semiconductor packages according to claim 3, further comprising at least one solder plate arranged on the base.

6. The stack structure of semiconductor packages according to claim 3, further comprising at least one fixing bump arranged on the base to fix the base onto a mother board.

7. The stack structure of semiconductor packages according to claim 3, wherein the base is a connector.

8. The stack structure of semiconductor packages according to claim 1, wherein the second plug-receiver further comprises a second concavity arranged oppositely to the first protrusion.

9. The stack structure of semiconductor packages according to claim 1, wherein the structures of the first package and second package are the same.

10. The stack structure of semiconductor packages according to claim 1, wherein the structures of the first plug-receiver and the second plug-receiver are the same.

11. The stack structure of semiconductor packages according to claim 1, wherein the first package further comprises:
    a first chip arranged on the first carrier plate;
    a plurality of conductive connection parts to electrically connect the first carrier plate and the chip; and
    a molding compound to cover the chip, the conductive connection parts and a portion of the first carrier plate and expose the first conductive terminals.

12. The stack structure of semiconductor packages according to claim 1, wherein the second package further comprises:
    a chip arranged on the carrier plate;
    a plurality of conductive connection parts to electrically connect the second carrier plate and the chip; and a molding compound to cover the chip, the conductive connection parts and a portion of the second carrier plate and expose the second conductive terminals.

13. The stack structure of semiconductor packages according to claim 1, wherein the first plug-receiver is a connector.

14. The stack structure of semiconductor packages according to claim 1, wherein the second plug-receiver is a connector.

15. A manufacturing method of a stack structure of semiconductor packages, comprising:

providing a first package having a first carrier plate, wherein a plurality of first conductive terminals are arranged on an upper surface and a lower surface of the first carrier plate;

providing at least one first plug-receiver to clamp on the first carrier plate and electrically connect with the first conductive terminals, wherein the first plug-receiver has a first concavity;

providing a second package having a second carrier plate, wherein a plurality of second conductive terminals are arranged on an upper surface and a lower surface of the second carrier plate; and providing at least one second plug-receiver to clamp on the second carrier plate and electrically connect with the second conductive terminals, wherein the second plug-receiver has a first protrusion inserting into the first concavity of the first plug-receiver to electrically connect the first package and the second package.

16. The manufacturing method of the stack structure of semiconductor packages according to claim 15, further comprising forming a second protrusion opposed to the first concavity on the first plug-receiver.

17. The manufacturing method of the stack structure of semiconductor packages according to claim 16, further comprising providing at least one base below the first plug-receiver, wherein the base has an accommodation trench to engage with the second protrusion of the first plug-receiver.

18. The manufacturing method of the stack structure of semiconductor packages according to claim 15, further comprising forming at least one fixing bump on the base to fix the base onto a mother board.

19. The manufacturing method of the stack structure of semiconductor packages according to claim 15, further comprising arranging at least one solder plate on the base.

* * * * *